US009140751B2

(12) United States Patent
Ong et al.

(10) Patent No.: US 9,140,751 B2
(45) Date of Patent: Sep. 22, 2015

(54) TESTING INTEGRATED CIRCUIT PACKAGING FOR OUTPUT SHORT CIRCUIT CURRENT

(71) Applicant: Texas Instruments Incorporated, Dallas, TX (US)

(72) Inventors: Chee Peng Ong, Ayer Keroh (MY); Wen Hui Woon, Kampung Bukit Godek (MY); Benyong Zhang, Federal Way, WA (US); Eric Lindgren, Federal Way, WA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 366 days.

(21) Appl. No.: 13/851,286

(22) Filed: Mar. 27, 2013

(65) Prior Publication Data
US 2014/0292361 A1  Oct. 2, 2014

(51) Int. Cl.
G01R 31/00 (2006.01)
G01R 31/317 (2006.01)

(52) U.S. Cl.
CPC .................. *G01R 31/31715* (2013.01)

(58) Field of Classification Search
CPC ........................................ G01R 31/00
USPC .............. 324/750.01, 762.02, 755.11, 756.05
See application file for complete search history.

(56) References Cited

U.S. PATENT DOCUMENTS

| 3,796,848 | A  | * | 3/1974  | Southworth, Jr. | ............. 200/175    |
| 4,504,783 | A  | * | 3/1985  | Zasio et al.    | ............. 324/750.01 |
| 5,371,457 | A  | * | 12/1994 | Lipp            | ............. 324/762.02 |
| 6,710,607 | B2 | * | 3/2004  | Fujii et al.    | ............. 324/754.03 |
| 6,940,299 | B1 | * | 9/2005  | Lim et al.      | ............. 324/762.02 |
| 7,049,842 | B2 | * | 5/2006  | Lopezdenava     | ............. 324/762.02 |
| 7,262,623 | B1 | * | 8/2007  | Mark et al.     | ............. 324/762.02 |
| 7,996,162 | B1 | * | 8/2011  | Zhang et al.    | ............. 702/58     |
| 8,451,014 | B2 | * | 5/2013  | Black et al.    | ............. 324/754.04 |
| 2005/0134301 | A1 | * | 6/2005 | Lopezdenava    | ............. 324/765    |
| 2005/0135357 | A1 | * | 6/2005 | Riegel et al.  | ............. 370/389    |
| 2006/0038578 | A1 | * | 2/2006 | Hashimoto      | ............. 324/765    |
| 2008/0050969 | A1 | * | 2/2008 | Josephson      | ............. 439/608    |
| 2014/0264331 | A1 | * | 9/2014 | Yao et al.     | ............. 257/48     |

* cited by examiner

*Primary Examiner* — Patrick Assouad
*Assistant Examiner* — Lamarr Brown
(74) *Attorney, Agent, or Firm* — Steven A. Shaw; Frank D. Cimino

(57) ABSTRACT

An electronic package having multiple pins may be tested in parallel for output short circuit current by simulating a direct short to ground by simultaneously connecting multiple output pins directly to ground in order to active a current limiter associated with each of the output pins. The pins are then connected to a resistive connection to ground via a set of resistors; the direct ground is then removed, such that the current limiter associated with each of the output pins remains activated. A voltage drop across each of the set of resistors is measured simultaneously. An output short circuit current fault is indicated when the voltage drop across any of the resistors exceeds a threshold value corresponding to a maximum output short circuit current value.

9 Claims, 5 Drawing Sheets

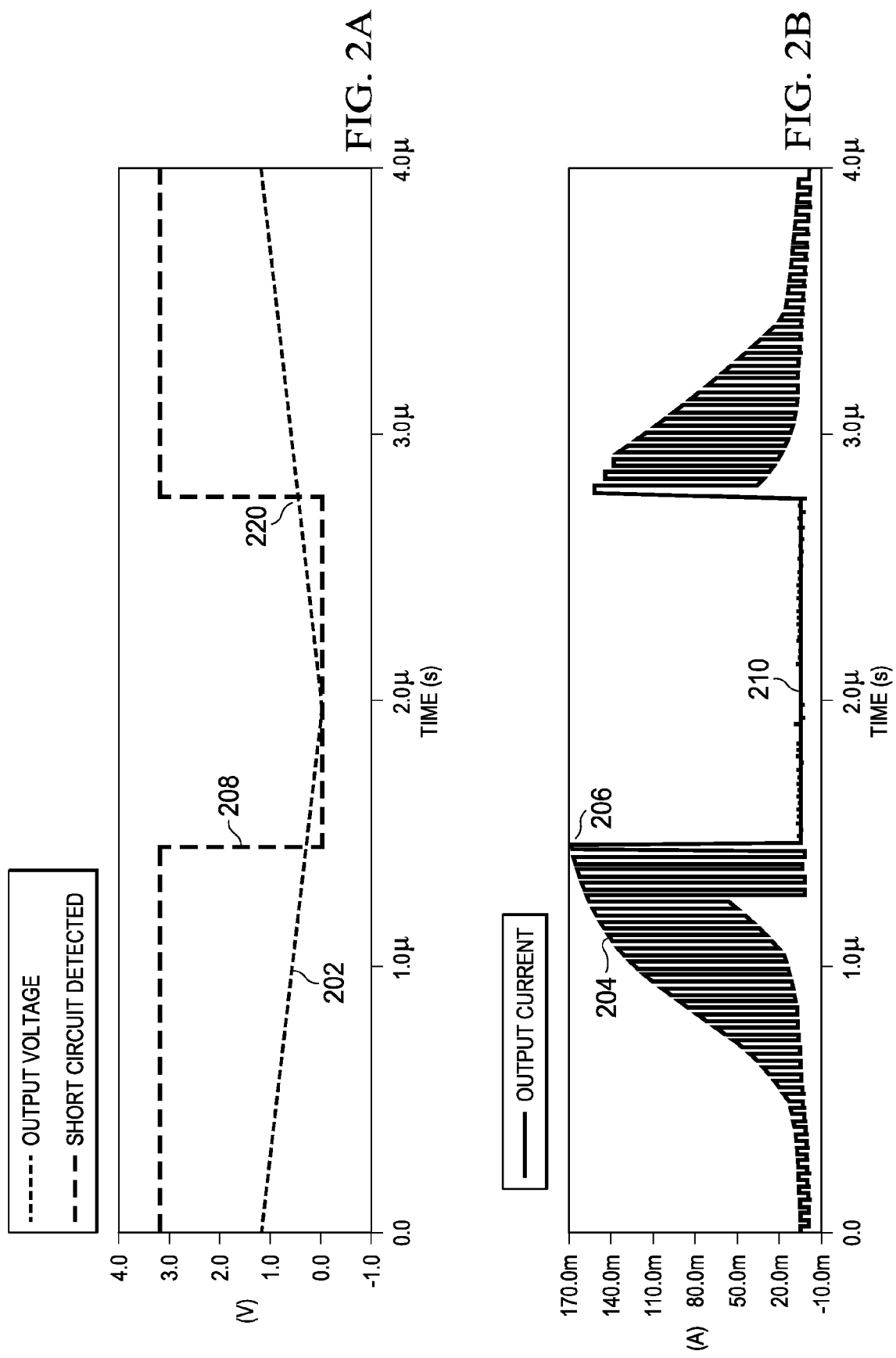

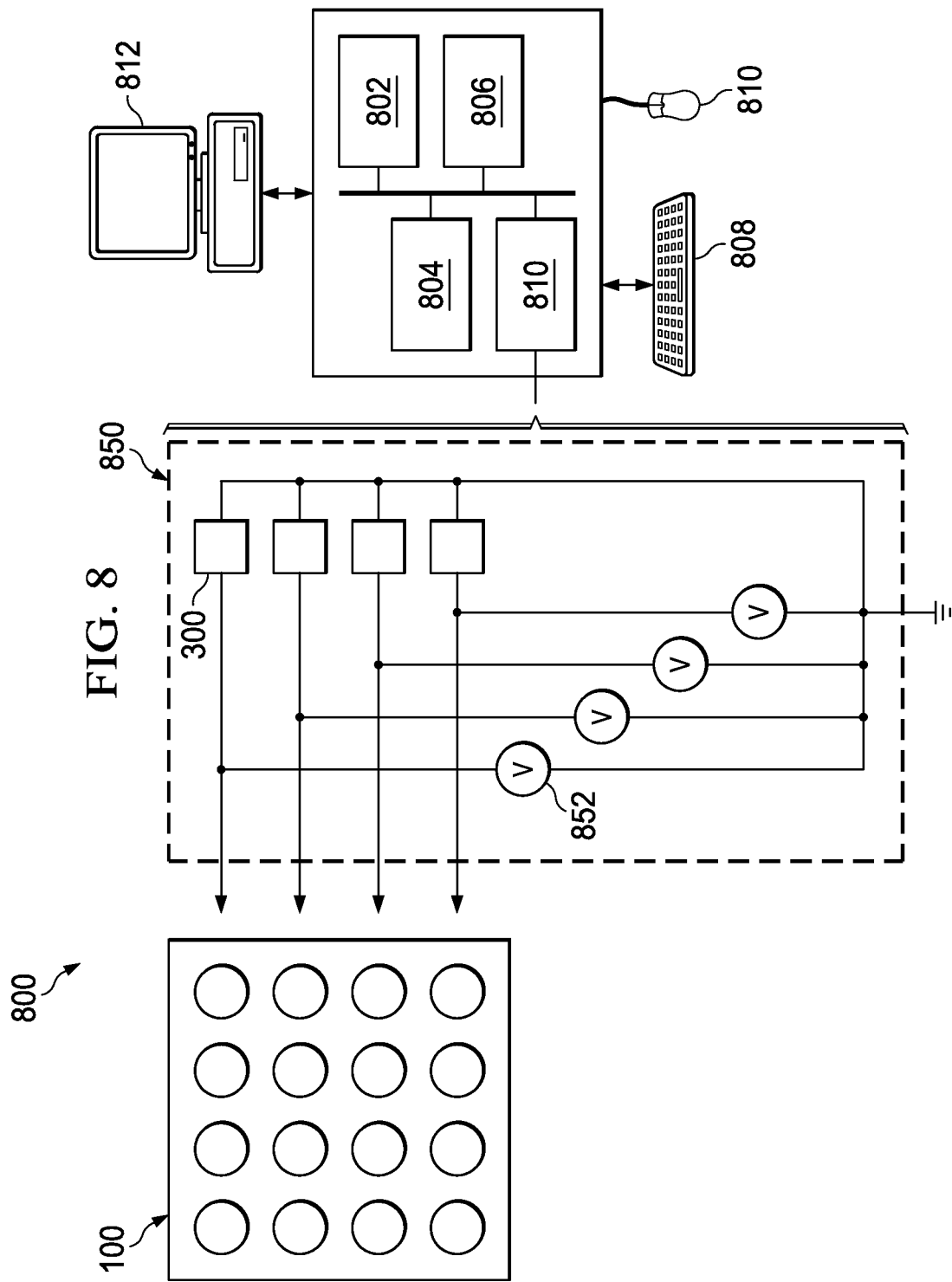

TESTING INTEGRATED CIRCUIT PACKAGING FOR OUTPUT SHORT CIRCUIT CURRENT

FIELD OF THE INVENTION

This invention generally relates to testing packaged integrated circuits, and particular to testing a large number of pins for output short circuit current in parallel.

BACKGROUND OF THE INVENTION

As the performance and complexity of integrated circuits (IC) has increased over the years, the number of input/output (I/O) pin count has also increased significantly. High density devices with high output pin count may have a large number of output pins that may require output short circuit current (IOS) testing. It is a common practice to perform output IOS testing in order to verify the integrity of a device output protective circuit in the event of short on the output pins. IOS test simulate the worst-case loading conditions on the output pin of a device. The test guarantees that whenever output current exceeds the trip point for the IOS detection in the event of a short, the current limiting block would kick in to prevent the device from exceeding its absolute maximum current carrying capability and protect the device from any damage. The IOS test is performed using a test device commonly referred to as ATE (automatic test equipment), which either sources or sinks current to the output pins being tested while simulating a short circuit from the pin to ground by forcing the output pin to 0V. In the absence of a fault condition, the ATE should detect a current flow from the output pin not exceeding the allowable limited current from the device protective circuit. If, however, there is a defect in the current protective circuit and the current limiting failed, a huge amount of current may flow out from the device and thus register a substantial increase in current measurement at the output pin.

IOS test may be performed serially by measuring current on each output pin by pin or it can be performed simultaneously for all the output pins depend on the tester resources capability and availability. Due to the tester current measuring resources capability and availability limitation in ATE environment, IOS testing is commonly performed serially pin by pin, which takes a significant amount of test time.

A chip scale package (CSP) is a type of integrated circuit chip carrier. In order to qualify as chip scale, the package typically has an area no greater than 1.2 times that of the die and it is a single-die, direct surface mountable package. Another criterion that is often applied to qualify these packages as CSPs is their ball pitch should be no more than 1 mm.

The die may be mounted on an interposer upon which pads or balls are formed, like with flip chip ball grid array (BGA) packaging, or the pads may be etched or printed directly onto the silicon wafer, resulting in a package very close to the size of the silicon die. Such a package is called a wafer-level chip-scale package (WL-CSP) or a wafer-level package (WLP).

BRIEF DESCRIPTION OF THE DRAWINGS

Particular embodiments in accordance with the invention will now be described, by way of example only, and with reference to the accompanying drawings:

FIGS. 2A and 2B are plots illustrating operation of the short circuit current limiting circuit of FIG. 1;

FIG. 8 is a block diagram illustrating a test system.

Figure 1:
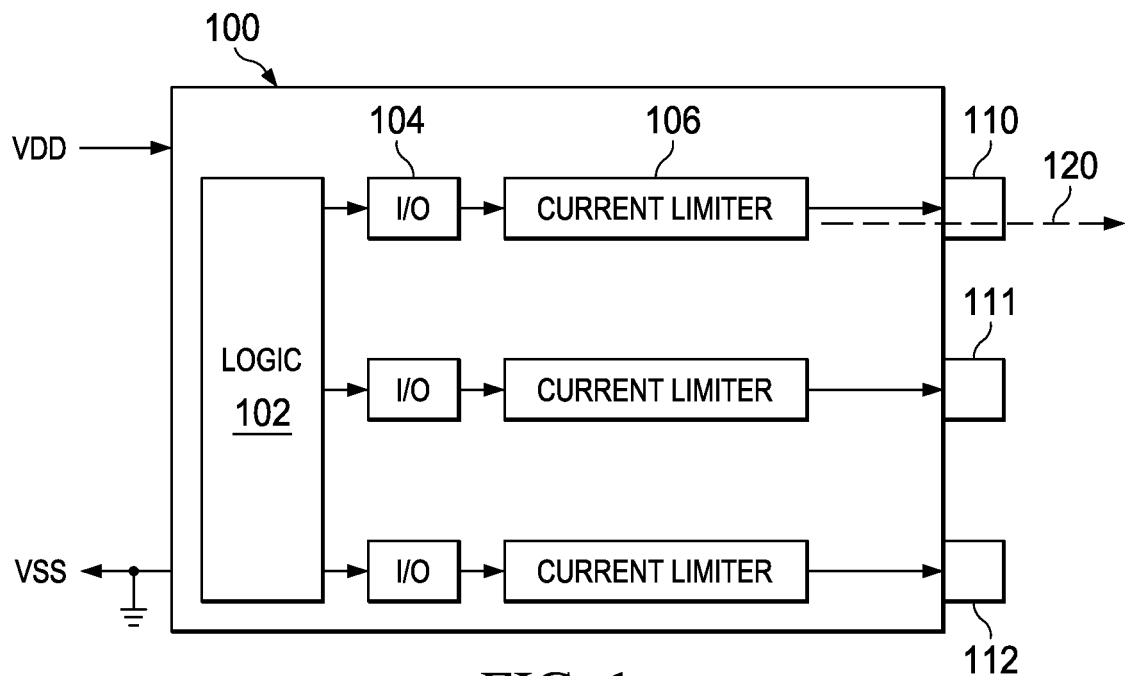
FIG. 1 is a schematic of a portion of a packaged device illustrating output short circuit current limiting circuits.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Automatic test equipment (ATE) used for mixed signal or digital device testing in the semiconductor industry commonly has a large number of high speed digital (HSD) pins for digital functionality testing. An HSD tester is a highly parallel testing instrument that is configured to perform tests for multiple pins simultaneously and is typically meant for functional testing of a logic circuit. A per pin measurement unit (PPMU) instrument on each HSD channel in the ATE has a parametric voltage or current measuring capability with average specifications for current or voltage measurement. PPMUs enable a test engineer to perform parametric current or voltage measurement in parallel (multiple pins simultaneously). Current measurement specification for PPMU is typically 2 mA for Teradyne Catalyst & Microflex ATE platform, and 50 mA for Teradyne Ultraflex ATE platform, for example.

To create an output short circuit current (IOS) condition on a device output pin, typically the output pin may be forced to 0V by an ATE power supply resource to simulate a short to ground condition. There is a drawback to using a power supply source and current measuring instrument due to the limitation of the number of power supply resources on a typical ATE. A power supply can only make one current measurement at a time. A conventional approach used in the past to deal with this problem for IOS test was to connect a device output pin to the power supply and make a current measurement pin by pin serially either through ATE internal matrix relays or relays added by users on a test board. As a result, IOS testing consumed a large amount of time.

A ball grid array (BGA) package, wafer-level chip-scale package (WL-CSP) and a wafer-level package (WLP) all have one thing in common; they each have a large number of densely packed pins that must be tested during production. As integrated circuit (IC) performance and complexity has increased over the years, the number of input/output (I/O) pin count has also increased significantly. High density devices with high output pin count which require IOS test increase the testing time even more and create a testing challenge if a conventional serial pin by pin test method is used for IOS testing. There is therefore a need for efficiently testing ICs for IOS, especially in high output pin count devices. One new method to speed up the testing time for IOS is to test device IOS in parallel for all pins. This involves a new design on IC testing test board and a new method for IOS parallel testing, as will be described herein.

FIG. 1 is a schematic of a portion of an example packaged device 100 illustrating output short circuit current limiting circuits 106. Packaged device 100 includes an integrated circuit that contains various logic circuits 102 that implement a desired function. In order to communicate with other electronic components that are external to packaged device 100, a set of interface pins is provided that are coupled to interface circuits on the integrated circuit, as is well known. Only three output pins 110-112 are illustrated; however it is understood that a typical packaged device 100 may have a large number of output pins; it is not uncommon to have over one hundred output pins, for example. Pin interface circuits 104 are representative of various types of interface circuits that may be coupled to an external package pin. For example, an interface circuit may include a receiver for receiving a signal via an interface pin from an external source. Likewise, an interface circuit may include a buffer or driver for driving a signal via an interface pin to an external destination. Some interface circuits may include both a receiver and a driver. Various known types and configurations of receivers and drivers may be implemented to handle the input and output needs of packaged device 100. Other interface circuits within packaged device 100 may be for other functions, such as coupling one or more voltage supplies and a ground reference to the integrated circuit, for example.

Output drivers 104 are coupled to output pins 110-112 via current limiting circuits 106. Interface pins 110-112 may be connected to ATE resources during a test. To create an output short circuit current (IOS) condition on a device output pin, typically the output pin is forced to 0V by an ATE resource to simulate a short to ground condition. When this condition occurs, current will rush out from the output pin immediately. As soon as the output current exceeds a trip point for IOS detection, i.e. approximately 170 mA in this example, IOS protective circuit 106 will kick in to limit the output current to an allowable current value, i.e. approximately 7 ma in this example. In order to trigger the IOS protective circuit, the ATE resource has to be able to sink more current than the trip point for the IOS detection, in this case approximately 120 mA. This range is way above what most of the PPMU current specifications can attain.

FIGS. 2A and 2B are plots illustrating operation of the short circuit current limiting circuit of FIG. 1. Assume an output driver 104 is receiving a signal for logic 102 to assert a signal on interface pin 110. If an external load is applied to pin 110 that cause the voltage on pin 110 to be pulled towards ground, as indicated by plot 202, current 120 will increase, as indicated by plot 204. Once an output current threshold is exceeded, such as 170 ma in this example, as indicated at 206, current limit circuit 106 will be triggered 208 and output current 120 will then be limited to about 15 ma in this example, as shown at 210. When the load on output pin 110 is reduced, voltage on pin 110 therefore is allowed to rise. Once the output voltage rise above a threshold value, as indicated at 220, current limit circuit 106 will be reset.

FIGS. 3-6 are schematics of a portion of a test apparatus for testing output short circuit current from a device under test. Embodiments of the invention provide an efficient method of testing for IOS on multiple output pins simultaneously instead of measuring IOS pin by pin serially in conventional method of testing.

Figure 7:
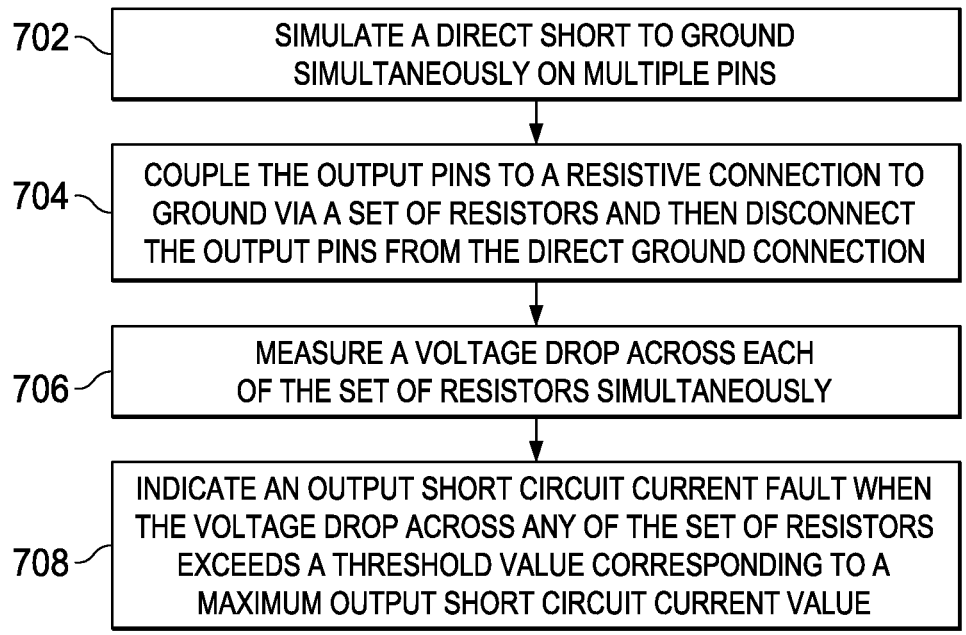
FIG. 7 is a flow chart illustrating testing a device for output short circuit current.
Figure 3:
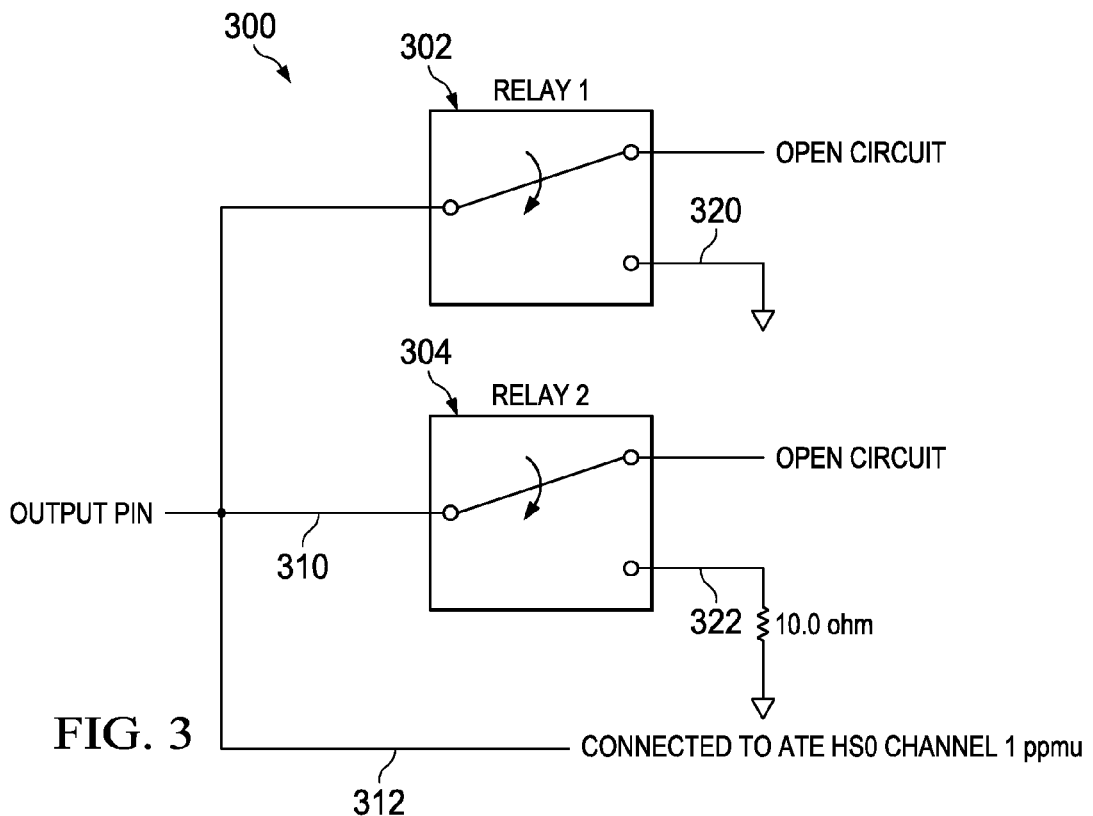
FIGS. 3-6 are schematics of a portion of a test apparatus for testing output short circuit current from a device under test.

Each output pin, such as output pin 110 of FIG. 1, is connected to two double throw relays 302, 304 via signal line 310 and also to an ATE tester channel per pin measurement unit (PPMU) that is configured to measure voltage via signal line 312. An output of relay 302 is connected directly to ground 320, while the other output of relay 302 is open. An output of relay 304 is connected to resistor R 322 and thereby to ground. The other output of relay 304 is open FIG. 7 is a flow chart illustrating testing a device for output short circuit current. The method involves three main steps to get the measurement of IOS on all the output pins simultaneously.

Simulate 702 a direct short to ground condition by connecting multiple output pins of the electronic package directly to ground while providing operating voltage to the electronic package to activate short circuit protection blocks 106 associated with each output pin in the device. Once the short circuit protection devices trigger on each of the pins, they will thereby limit IOS current on all the device output pins simultaneously.

Switch 704 the direct short to ground condition on all the device output pins to a resistive short via a resistor R to ground while making sure that IOS protection mode remains activated.

Measure 706 the voltage drop across a resistor R on each output pin simultaneously using an ATE tester channel PPMU.

A calculation 708 of the IOS current on each output pin may be done by dividing the measured voltage with the resistor value, I=V/R based on Ohm's law.

A purpose of IOS test is to determine if the short circuits detect system in the device is working correctly. If the IOS protect does not kick in, the voltage across the resistor R should be significantly higher than if it is working and bad devices can be screened out according to a voltage or current limit that may be set based on the results from the good devices. Converting currents to voltages is much easier and faster and the ATE channel PPMU can easily measure the voltage across resistor R on the device output via signal line 312. This may be done in parallel on all output pins of the device under test at the same time, thereby reducing a very large chunk of the IOS test time.

Figure 4:
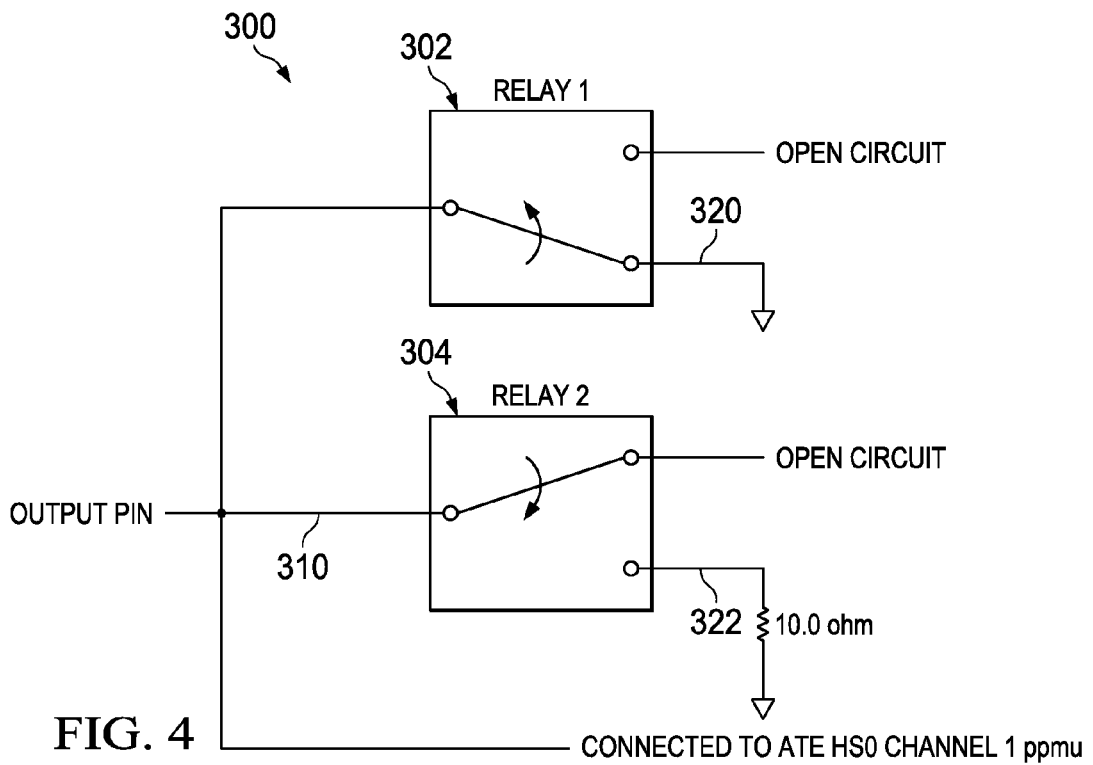
Figure 5:
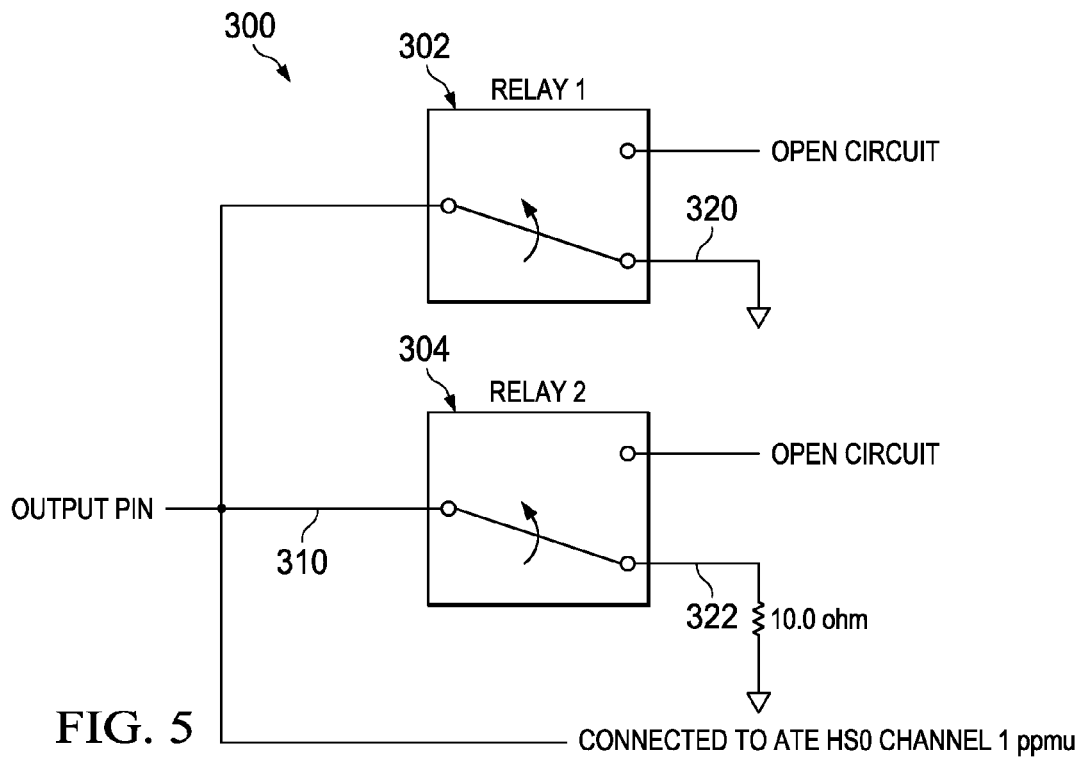

Returning again to FIG. 3, initially both relays 302, 304 are set to the open circuit position. FIG. 4 shows the first step in setting up IOS test. The device output is directly shorted to ground through relay 302 while relay 304 remains set to the open circuit. However, in another embodiment, relays 302 and 304 may both be activated simultaneously. This shorts the device output to ground to ensure output current flow from the device output driver is high enough to trip the short circuit protection block 106 in the device. When the IOS condition is created on the device output, relay 304 is turned on to connect to series resistor R 322 which is connected to the output while relay 302 still remains closed, as shown in FIG. 5. In this stage, even though the device output is connected through relay 304 with a series resistor R to ground in addition to the direct connection of device output to ground through relay 302, current flow remains unchanged because, in reality, current will always follow the path of least resistance to ground, which in this case is typically the path that goes through relay 302.

Figure 6:
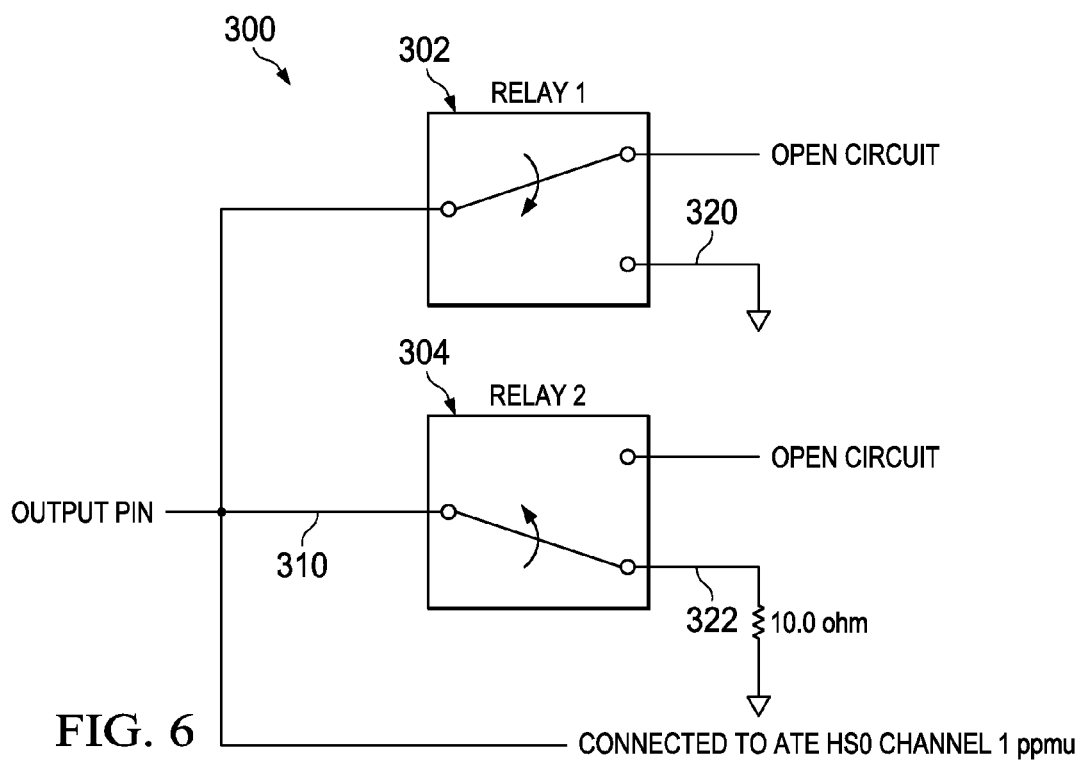

In FIG. 6, relay 302 is released so that the device output pin is connected to ground only through relay 304 through resistor R. This will create a resistive short path from the device output to ground. Selection of resistor R value is determined in order to make sure that the short circuit protective circuit remains activated while the voltage across resistor R is being measured. The voltage across relay 304 and the resistor R is measured by using the ATE tester channel per pin measurement unit (PPMU). For example, if the IOS current is limited to a range of 7 mA by the short circuit protective block, the voltage at the device output pin with a 10 ohm resistor connected to ground through relay 304 should be approximately 70 mv. After the IOS test is done, relay 304 is released and the output should return to its normal output voltage depending on whether logic high or logic low on the device output is pre-conditioned.

Thus in just four steps, all the output pins can be tested for IOS. This approach is applicable to all packages or devices, where IOS test needs to be performed on the device output pins. It will be appreciated that by reducing the number of tests or iterations for the short circuit current testing of output pins, the test time is considerably reduced. In fact, it is possible to keep this test time down to only tens of milliseconds regardless of the number of output pins.

In practice, an additional consideration has to be borne in mind. Care has to be taken in selection of a low impedance relay and resistor R value. In order to ensure correct IOS testing, it is necessary to get the output short circuit current simulation results from IC designers prior to test hardware design.

Referring again to FIG. 2A, an example of a designer's current simulation plot is shown for a clock buffer chip with multiple low voltage differential swing (lvds) output pins, where IOS test is supposed to be performed on all the lvds output pins. Based on the simulation example, device output voltage is ramped from 1.25 v to 0 v as illustrated at 202 then back to 1.25v as illustrated at 220. A resulting current is indicated in FIG. 2B.

In this example, as soon as the device output is shorted to ground and a high current mode is detected, current limiting cycling 204 will occur to reduce IOS current. When the output voltage drops below 300 mV, the IOS protective block kicks in as illustrated at 208, output will go into full IOS protection mode, and the maximum current is limited by the internal circuitry to be around 7 mA, as illustrated at 210. As long as the voltage at the outputs remains below 500 mV, the IOS protect mode will stay enabled until the output voltage reaches approximately 500 mV where the normal output mode is re-enabled. If the short is removed (output goes above 500 mV), then the normal operation is resumed.

Based on the simulation results of 7 mA IOS current and 500 mV of IOS protection mode de-activate threshold voltage in this example, in order to keep the device outputs in pure IOS protection mode while having a resistive short to ground through relay 304 discussed above, resistor R should not exceed value of approximately 71 Ohm (500 mV/7 mA). In reality, a 10 ohm resistor works well.

While embodiments of the present invention have been discussed with respect to a specific device, the invention is not limited to a particular IC structure or ATE type.

Embodiments of the invention may reduce IOS testing time and contribute to lower test cost.

The amount of IOS test time saving depends on the total number of output pins where IOS test is performed. The higher the output pin counts, the more test time savings may be achieved.

Here is an example calculation. IOS test time comparison for a device with 20 output pins, serial method (conventional) vs. parallel method. Estimated test time needed for one pin IOS measurement=50 ms. Total IOS test time: conventional method=50 ms*20 pins=1 S; parallel method=50 ms.

FIG. 8 is a block diagram illustrating multiple sets 850 of test apparatus 300 coupled to voltage measuring devices (V) 852. While only four instantiations of test apparatus 300 and associated voltmeter 852 are illustrated, a typical embodiment may have a large number of instantiations. Test system 850 is controlled by a control system 800. Control system 800 may be a personal computer, a rack mount computer, a process control computer, or other now known or later developed control system that may be used in a production or lab environment, for example. Control system 800 includes a processor 802, associated memory 804 for holding processor executable instructions that define the test operation, a storage device 806, and numerous other elements and functionalities typical of digital systems (not shown). In one or more embodiments, a control system may include multiple processors. The digital system 800 may also include input means, such as a keyboard 808 and a mouse 810 (or other cursor control device), and output means, such as a monitor 812 (or other display device). Those skilled in the art will appreciate that the input and output means may take other forms.

The control system 800 may be connected to a network (not shown) (e.g., a local area network (LAN), a wide area network (WAN) such as the Internet, a cellular network, any other similar type of network and/or any combination thereof) via a network interface connection (not shown).

Control system 800 includes input/output logic 810 that may be controllably coupled to the various current sources and voltmeters within test apparatus 300 in order to cause test apparatus 300 to function as described above in order to perform output short circuit current testing on all pins of device under test 100 in parallel.

The general concept of controlling a test apparatus with a control system and reporting defecting units under test is well known and need not be described in further detail herein. Such a test apparatus and control system may be part of a production line test bed, or may be a standalone system, for example. Techniques for connecting a test apparatus to all of the pins of a packaged device under test is also well known; for example, a test socket may be used, a "bed of nails" arrangement maybe used, etc. Similarly, techniques for selectively controlling relays, and voltage monitoring of pins of a device under test are well known, such as by use of relays, switching devices, transfer gates, etc.

OTHER EMBODIMENTS

While the invention has been described with reference to illustrative embodiments, this description is not intended to be construed in a limiting sense. Various other embodiments of the invention will be apparent to persons skilled in the art upon reference to this description. For example, IOS test is typically performed on the part that has the current limiter designed in. However, if IOS is to be performed on part that does not have current limiters, it can still be done by the same method of measuring a voltage drop across each of the resistors simultaneously.

While multiple voltmeters are illustrated herein, other embodiments may use other devices for determining voltage levels, for example: sample and hold circuits coupled to analog to digital converters, etc.

While the embodiment described herein tested for a short to ground, a switching device may also be connected to a voltage source instead of ground for testing a driver that sinks an output signal current to ground.

While two double throw relays are illustrated herein for connecting each pin to a direct short and then to a resistive short, other types of switching devices may be used, such as: single throw relays, semiconductor switches having low on-resistance, a rotary, stepping switch, reed relays, etc. as long as the short circuit current is maintained while switching from a direct short to resistive short.

In another embodiment, a switch may be connected in series with a resistor, and another switch connected across the resister to provide this function described herein.

In another embodiment, the switching device may be implemented by a semiconductor device that can be controlled to provide a high resistance off state, a very low on resistance to simulate a direct short and then be modified to present a resistive value to allow a voltage measurement.

The testing techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP), for example. The software that executes the techniques may be initially stored in a non-transitory computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for testing an electronic package having multiple pins for output short circuit current, the method comprising:
   simulating a direct short to ground by simultaneously connecting a plurality of output pins of the electronic package directly to ground while providing operating voltage to the electronic package, whereby a current limiter associated with each of the plurality of output pins is activated;
   coupling the plurality of output pins to a resistive connection to ground via a plurality of resistors and then disconnecting the plurality of output pins from the direct ground connection, such that the current limiter associated with each of the plurality of output pins remains activated; and
   measuring a voltage drop across each of the plurality of resistors simultaneously.

2. The method of claim 1, further comprising indicating an output short circuit current fault when the voltage drop across any of the plurality of resistors exceeds a threshold value corresponding to a maximum output short circuit current value.

3. The method of claim 1, further comprising calculating an output short circuit current for each of the plurality of output pins correspond to the measured voltage drop across each of the plurality of resistors; and
   indicating an output short circuit current fault when the calculated output short circuit current for any of the plurality of output pins exceeds a threshold value corresponding to a maximum output short circuit current value.

4. The method of claim 1, wherein simulating a direct short to ground activates a current limiting circuit coupled to each of the plurality of output pins.

5. A test system for testing an electronic package having an array of pins for shorts, the test system comprising:
   a plurality of switching devices configured to connect each pin to provide a direct short and then a resistive short; and
   a plurality of volt measuring devices coupled to a respective one of the plurality of switching devices configured to measure a voltage across the resistive short;
   a control system coupled plurality of switching devices, the control system configured to:
   simulate a direct short to ground by simultaneously connecting a plurality of output pins of the electronic package directly to ground while providing operating voltage to the electronic package, whereby a current limiter associated with each of the plurality of output pins is activated;
   couple the plurality of output pins to a resistive connection to ground via a plurality of resistors and then disconnect the plurality of output pins from the direct ground connection, such that the current limiter associated with each of the plurality of output pins remains activated; and
   measure a voltage drop across each of the plurality of resistors simultaneously.

6. The test system of claim 5, wherein the test system is further operable to indicate an output short circuit current fault when the voltage drop across any of the plurality of resistors exceeds a threshold value corresponding to a maximum output short circuit current value.

7. The method of claim 5, wherein the test system is further operable to calculate an output short circuit current for each of the plurality of output pins correspond to the measured voltage drop across each of the plurality of resistors; and
   indicate an output short circuit current fault when the calculated output short circuit current for any of the plurality of output pins exceeds a threshold value corresponding to a maximum output short circuit current value.

8. A non-transitory computer readable medium storing software instructions that when executed by the processor to perform a method for testing an electronic package having an array of pins for output short circuit current, the method comprising:
   simulating a direct short to ground by simultaneously connecting a plurality of output pins of the electronic package directly to ground while providing operating voltage to the electronic package, whereby a current limiter associated with each of the plurality of output pins is activated;

coupling the plurality of output pins to a resistive connection to ground via a plurality of resistors and then disconnecting the plurality of output pins from the direct ground connection, such that the current limiter associated with each of the plurality of output pins remains activated; and measuring a voltage drop across each of the plurality of resistors simultaneously.

9. The method of claim 8, further comprising indicating an output short circuit current fault when the voltage drop across any of the plurality of resistors exceeds a threshold value corresponding to a maximum output short circuit current value.

* * * * *